United States Patent
Fukumoto et al.

(10) Patent No.: US 12,451,406 B2
(45) Date of Patent: Oct. 21, 2025

(54) SILICON NITRIDE SUBSTRATE AND METHOD OF MANUFACTURING THE SAME

(71) Applicant: Proterial, Ltd., Tokyo (JP)

(72) Inventors: Rei Fukumoto, Tokyo (JP); Youichiro Kaga, Tokyo (JP); Kei Shimada, Tokyo (JP)

(73) Assignee: PROTERIAL, LTD., Tokyo (JP)

( * ) Notice: Subject to any disclaimer, the term of this patent is extended or adjusted under 35 U.S.C. 154(b) by 407 days.

(21) Appl. No.: 18/173,146

(22) Filed: Feb. 23, 2023

(65) Prior Publication Data

US 2023/0275002 A1 Aug. 31, 2023

(30) Foreign Application Priority Data

Feb. 25, 2022 (JP) .................... 2022-027436

(51) Int. Cl.
| | |
|---|---|
| H01L 23/34 | (2006.01) |
| H01L 21/48 | (2006.01) |
| H01L 23/373 | (2006.01) |
| H01L 25/07 | (2006.01) |
| H02P 27/06 | (2006.01) |

(52) U.S. Cl.
CPC ...... H01L 23/3735 (2013.01); H01L 21/4807 (2013.01); H01L 25/072 (2013.01); H02P 27/06 (2013.01)

(58) Field of Classification Search
None
See application file for complete search history.

(56) References Cited

U.S. PATENT DOCUMENTS

| | | | |
|---|---|---|---|
| 6,232,657 B1* | 5/2001 | Komorita | C04B 35/584 |
| | | | 257/713 |
| 2016/0120017 A1* | 4/2016 | Momoi | C04B 37/021 |
| | | | 156/247 |
| 2022/0102229 A1* | 3/2022 | Ichikawa | H01L 23/3732 |
| 2023/0274992 A1* | 8/2023 | Suenaga | H01L 22/12 |

FOREIGN PATENT DOCUMENTS

| | | |
|---|---|---|
| CN | 108495831 A | 9/2018 |
| CN | 109987944 A | 7/2019 |
| EP | 0 963 965 A1 | 12/1999 |
| EP | 3 438 075 A | 2/2019 |
| JP | S58-91147 A | 5/1983 |

(Continued)

OTHER PUBLICATIONS

Extended European Search Report corresponding to European Patent Application No. 23275029.9, dated Jun. 30, 2023.

(Continued)

*Primary Examiner* — Benjamin P Sandvik
(74) *Attorney, Agent, or Firm* — McCormick, Paulding & Huber PLLC

(57) ABSTRACT

Color unevenness generated on a surface of a silicon nitride substrate is reduced. A silicon nitride substrate formed by nitriding silicon containing in a sheet-shaped green body includes a first surface and a second surface opposite to the first surface. In this case, when color difference between a center and an edge of at least one surface of the first surface and the second surface is expressed to be "$\Delta E^*ab$", a relation "$\Delta E^*ab \leq 1.5$" is established.

8 Claims, 4 Drawing Sheets

(56) References Cited

FOREIGN PATENT DOCUMENTS

| | | |
|---|---|---|
| JP | H09227240 A | 9/1997 |
| JP | 2002-029851 A | 1/2002 |
| JP | 2003267786 A | 9/2003 |
| JP | 2005214659 A | 8/2005 |
| JP | 2016204206 A | 12/2016 |
| JP | 2016204207 A | 12/2016 |
| JP | 2016204209 A | 12/2016 |
| JP | 2016204210 A | 12/2016 |
| WO | 2022/196693 A1 | 9/2022 |

OTHER PUBLICATIONS

Office Action for Taiwanese Patent Application No. 112106682, dated Dec. 4, 2023.
Korean Examination Results and its English translation for corresponding Korean Patent Application No. 10-2023-0023449 dated Aug. 7, 2024.

\* cited by examiner

SILICON NITRIDE SUBSTRATE AND METHOD OF MANUFACTURING THE SAME

CROSS-REFERENCE TO RELATED APPLICATION

This application claims foreign priority benefits under 35 U.S.C. § 119 from Japanese Patent Application No. 2022-027436, filed Feb. 25, 2022, the content of which is hereby incorporated by reference in its entirety.

TECHNICAL FIELD

The present invention relates to a silicon nitride substrate and a method of manufacturing the same, and relates to a technique effectively applied to a silicon nitride substrate having a thermal conductivity that is equal to or higher than, for example, 110 W/(m·K), and to a method of manufacturing the same.

BACKGROUND

Japanese Patent Application Laid-Open Publication No. 2003-267786 (Patent Document 1) describes a technique for providing a silicon nitride-based ceramic sintered body having a sintered-body color that is blacker and less color unevenness than those of a related-art material and having a sufficient strength.

Japanese Patent Application Laid-Open Publication No. 2005-214659 (Patent Document 2) describes a technique related to a foreign-object inspection apparatus capable of identifying even a foreign object having a smaller color contrast than that of a color of a wiring board.

Japanese Patent Application Laid-Open Publication No. 2016-204206 (Patent Document 3), Japanese Patent Application Laid-Open Publication No. 2016-204207 (Patent Document 4), Japanese Patent Application Laid-Open Publication No. 2016-204209 (Patent Document 5) and Japanese Patent Application Laid-Open Publication No. 2016-204210 (Patent Document 6) describe a technique for providing a silicon nitride-based ceramic member having small weight, high hardness, excellent endurance against processes such as polishing, and besides, excellent exterior quality.

Japanese Patent Application Laid-Open Publication No. H09 (1997)-227240 (Patent Document 7) describes a technique capable of thinning a surface color-adjusting portion of a silicon nitride ceramic sintered body, and besides, equalizing break strength properties of a surface layer and an inner layer.

Patent Document 1: Japanese Patent Application Laid-Open Publication No. 2003-267786
Patent Document 2: Japanese Patent Application Laid-Open Publication No. 2005-214659
Patent Document 3: Japanese Patent Application Laid-Open Publication No. 2016-204206
Patent Document 4: Japanese Patent Application Laid-Open Publication No. 2016-204207
Patent Document 5: Japanese Patent Application Laid-Open Publication No. 2016-204209
Patent Document 6: Japanese Patent Application Laid-Open Publication No. 2016-204210
Patent Document 7: Japanese Patent Application Laid-Open Publication No. H09 (1997)-227240

SUMMARY

For example, adhesion of foreign objects and dusts on a surface of a silicon nitride substrate becomes a cause of contact failure with a "brazing member" or insulation failure of the silicon nitride substrate itself, and therefore, it is necessary to remove the foreign objects and dusts. Therefore, in order to detect the adhesion of foreign objects and dusts on the silicon nitride substrate, an appearance test is performed. A method of the appearance test includes a method for detecting the foreign objects and dusts by, for example, causing an image-capturing apparatus typified by a CCD camera to capture an image of the surface of the silicon nitride substrate, and then, comparing image data of the captured image and previously-registered reference data.

However, if there is color unevenness at, for example, a center and an edge of the surface of the silicon nitride substrate, the above-described appearance test method causes a risk that the color unevenness is erroneously detected as the adhesion of foreign objects and dusts.

Regarding this point, in order to prevent the color unevenness from being erroneously detected as the adhesion of foreign objects and dusts, it is conceivable to ease a criterion for the detection of the adhesion of foreign objects and dusts. However, this case causes a risk that is failure to detect the foreign objects and dusts. Therefore, in consideration of the color unevenness, it is also conceivable to make the difference in the reference data between the center and the edge of the silicon nitride substrate to improve an accuracy of the detection of the adhesion of foreign objects and dusts. However, this case complicates test conditions.

From the above description, it is found that the appearance test with the high accuracy is difficult if the surface of the silicon nitride substrate has the color unevenness. Therefore, in order to achieve the appearance test with the high accuracy, it is important to reduce the color unevenness generated on the surface of the silicon nitride substrate.

A purpose of the present invention is to reduce the color unevenness generated on the surface of the silicon nitride substrate.

A silicon nitride substrate according to an embodiment is a silicon nitride substrate formed by nitriding silicon contained in a sheet-shaped green body, and includes a first surface and a second surface opposite to the first surface. In this case, when color difference between a center and an edge of at least one surface of the first surface and the second surface is expressed to be "$\Delta E^*ab$", a relation "$\Delta E^*ab \leq 1.5$" is established.

A method of manufacturing a silicon nitride substrate according to an embodiment includes: a step (a) of preparing a slurry containing silicon power; a step (b) of forming a green body from the slurry; and a step (c) of sintering the green body in a furnace. In this case, the step (c) includes a nitriding step of nitriding the green body by heating it at a predetermined heating temperature, and temperature difference between the heating temperature and a temperature of the green body in the furnace is equal to or lower than 20° C.

According to the embodiment, the color unevenness generated on the surface of the silicon nitride substrate can be reduced.

BRIEF DESCRIPTIONS OF THE DRAWINGS

DETAILED DESCRIPTION

The same components are denoted by the same reference signs in principle throughout all the drawings for describing the embodiments, and the repetitive description thereof will be omitted. Note that hatching is used even in a plan view so as to make the drawings easy to see.

A silicon nitride substrate of the present embodiment is an insulation substrate used for a power module. The power module is an electronic device configuring, for example, an electric vehicle, a hybrid electric vehicle, a rail vehicle, or an inverter circuit controlling a motor of an industrial apparatus.

<Configuration Example of Three-Phase Inverter Circuit>

A three-phase inverter circuit will be exemplified and explained below.

The power module is used for, for example, a driving circuit of a three-phase induction motor used for an air conditioner or others. Specifically, this driving circuit includes an inverter circuit, and this inverter circuit is a circuit having a function of converting a direct-current power to an alternating-current power.

Figure 1:
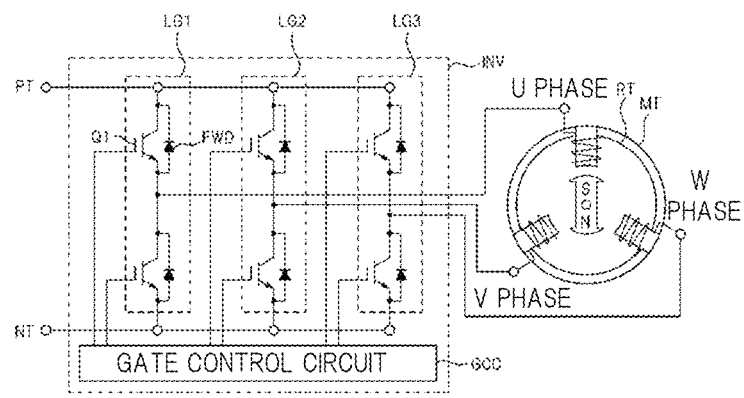
FIG. 1 is a diagram showing a motor circuit including an inverter circuit and a three-phase induction motor.

FIG. 1 is a circuit diagram showing a configuration of a motor circuit including an inverter circuit and a three-phase induction motor. In FIG. 1, the motor circuit including an inverter circuit INV and a three-phase induction motor MT. The three-phase induction motor MT is configured to be driven by three-phase voltages having different phases from one another. Specifically, in the three-phase induction motor MT, alternating currents of three phases that are so-called U phase, V phase and W phase, shifting by 120 degrees from one another, are used to generate a rotating magnetic field around a rotor RT that is a conductor. In this case, the magnetic field rotates around the rotor RT. This means that the magnetic flux crossing the rotor RT that is the conductor varies. As a result, electromagnetic induction is generated on the rotor RT that is the conductor, and induction current is flown in the rotor RT. And, the flowing of the induction current in the rotating magnetic field means that a power is applied to the rotor RT because of the Fleming's left-hand rule, and the rotor RT is rotated by this power.

From the above description, it is found that the rotor RT can be rotated by the usage of the three-phase alternating currents in the three-phase induction motor MT. In other words, the three-phase induction motor MT needs the three-phase alternating currents. Accordingly, in the motor circuit, the three-phase alternating currents are supplied to the three-phase induction motor by the usage of the inverter circuit INV generating the alternating current from the direct current.

A configuration example of this inverter circuit INV will be explained below.

As shown in FIG. 1, for example, the inverter circuit INV is provided with a switching element Q1 and a diode FWD corresponding to each of the three phases. In other words, in the inverter circuit INV, components of the inverter circuit INV are achieved by a configuration of anti-parallel connection of the switching element Q1 and the diode FWD as shown in FIG. 1. For example, in FIG. 1, each of an upper arm and a lower arm of a first leg LG1, an upper arm and a lower arm of a second leg LG2 and an upper arm and a lower arm of a third leg LG3 is made of the component made of the anti-parallel connection of the switching element Q1 and the diode FWD.

In other words, in the inverter circuit INV, the switching element Q1 and the diode FWD are connected in the anti-parallel connection formation between a positive potential terminal PT and each of the phases (U phase, V phase and W phase) of the three-phase induction motor MT, and the switching element Q1 and the diode FWD are also connected in the anti-parallel connection formation between a negative potential terminal NT and each of the phases of the three-phase induction motor MT. In other words, two switching elements Q1 and two diodes FWD are arranged for each phase, and six switching elements Q1 and six diodes FWD are arranged for the three phases. A gate control circuit GCC is connected to a gate electrode of each of the switching elements Q1, and a switching operation of the switching element Q1 is controlled by this gate control circuit GCC. In the inverter circuit INV configured as described above, since the switching operation of the switching element Q1 is controlled by this gate control circuit GCC, the direct-current power is converted to the three-phase alternating-current power, and this three-phase alternating-current power is supplied to the three-phase induction motor MT.

<Type of Switching Element>

For example, a power MOSFET and an IGBT (Insulated Gate Bipolar Transistor) are exemplified as the switching element Q1 used for the inverter circuit INV.

<Mounting Layout Example of Inverter Circuit>

Figure 2:
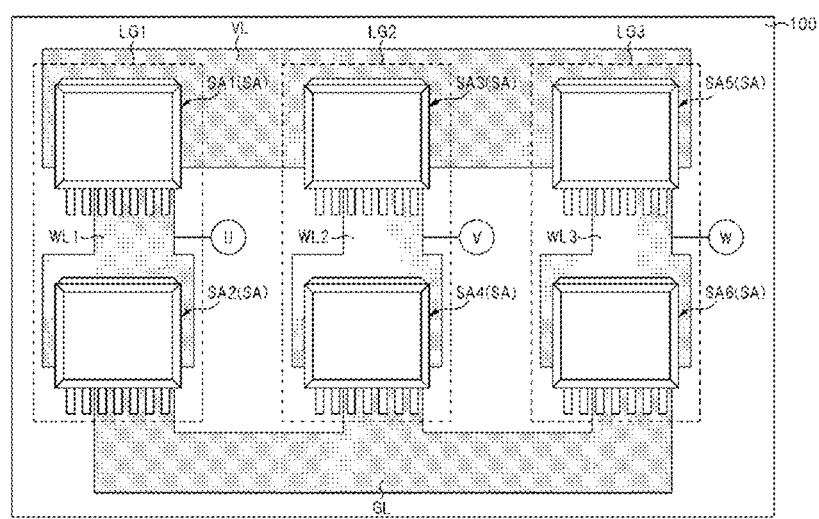
FIG. 2 is a schematic diagram showing a mounting layout example for achieving the inverter circuit.

FIG. 2 is a schematic diagram showing a mounting layout example for achieving the inverter circuit.

In FIG. 2, on a silicon nitride substrate 100 that is an insulating substrate, a power supply wiring VL, wirings WL1 to WL3 and a ground wiring GL are formed. A power supply potential is supplied to the power supply wiring VL, while a ground potential is supplied to the ground wiring GL. The wiring WL1 is connected to the U phase of the three-phase induction motor, the wiring WL2 is connected to the V phase of the three-phase induction motor, and the wiring WL3 is connected to the W phase of the three-phase induction motor. Note that the silicon nitride substrate 100 and wiring patterns formed on this silicon nitride substrate 100 are collectively referred to as "silicon nitride circuit board" in some cases. Therefore, as shown in FIG. 2, semiconductor devices SA1 to SA6 are mounted on the "silicon nitride circuit board".

As shown in FIG. 2, the semiconductor device SA1 is connected between the power wiring VL and the wiring WL1, while the semiconductor device SA2 is connected between the wiring WL1 and the ground wiring GL. In other words, the semiconductor device SA1 and the semiconductor device SA2 are connected in series between the power wiring VL and the ground wiring GL to configure the first leg LG1 of the inverter circuit INV shown in FIG. 1. In other words, the semiconductor device SA1 configures the upper arm of the first leg LG1, and the semiconductor device SA2 configures the lower arm of the first leg LG1. Each of the semiconductor device SA1 and the semiconductor device SA2 includes a semiconductor chip including the power MOSFET functioning as the switching element Q1 formed therein.

Similarly, the semiconductor device SA3 is connected between the power wiring VL and the wiring WL2, while the semiconductor device SA4 is connected between the wiring WL2 and the ground wiring GL. In other words, the semiconductor device SA3 and the semiconductor device SA4 are connected in series between the power wiring VL and the ground wiring GL to configure the second leg LG2 of the inverter circuit INV shown in FIG. 1. In other words, the semiconductor device SA3 configures the upper arm of the second leg LG2, and the semiconductor device SA4 configures the lower arm of the second leg LG2. Each of the semiconductor device SA3 and the semiconductor device SA4 includes a semiconductor chip including the power MOSFET functioning as the switching element Q1 formed therein.

Further, the semiconductor device SA5 is connected between the power wiring VL and the wiring WL3, while the semiconductor device SA6 is connected between the wiring WL3 and the ground wiring GL. In other words, the semiconductor device SA5 and the semiconductor device SA6 are connected in series between the power wiring VL and the ground wiring GL to configure the third leg LG3 of the inverter circuit INV shown in FIG. 1. In other words, the semiconductor device SA5 configures the upper arm of the third leg LG3, and the semiconductor device SA6 configures the lower arm of the third leg LG3. Each of the semiconductor device SA5 and the semiconductor device SA6 includes a semiconductor chip including the power MOSFET functioning as the switching element Q1 formed therein.

Since the six semiconductor devices SA1 to SA6 are arranged on the silicon nitride substrate 100 on which the power wiring VL, the wirings WL1 to WL3 and the ground wiring GL are formed as described above (see FIG. 2), the mounting layout supporting the inverter circuit INV can be achieved.

<Necessary Performance of Silicon Nitride Substrate>

As described above, the semiconductor devices SA1 to SA6 are mounted on the silicon nitride substrate 100. In this case, since heat is generated in the semiconductor devices SA1 to SA6, it is necessary to prevent the malfunction and the failure in the semiconductor devices SA1 to SA6 due to the heat. Therefore, for the silicon nitride substrate 100 on which the semiconductor devices SA1 to SA6 are mounted, high heat-release property is required. In other words, the silicon nitride substrate 100 is required to have high thermal conductivity. Further, the silicon nitride substrate 100 is also required to have endurance against a stress generated by temperature change.

Attention will be particularly paid to the thermal conductivity below.

<Explanation for Related Art>

First, a related art for manufacturing the silicon nitride substrate will be explained.

The "related art" described in the present specification is not a publicly-known technique but a technique having problems found by the present inventors, and is a premise technique of the invention of the present application.

Figure 3:
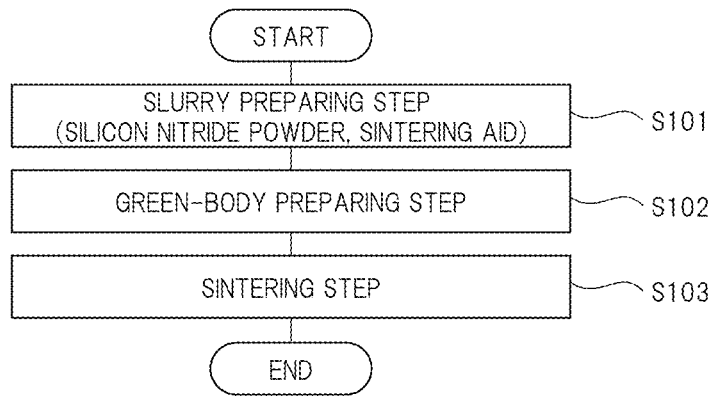
FIG. 3 is a flowchart showing steps of manufacturing a silicon nitride substrate according to a related art.

FIG. 3 is a flowchart showing steps of manufacturing a silicon nitride substrate according to the related art.

Slurry that is a dispersed material of a raw material powder is prepared by adding a rare-earth element oxide and a magnesium compound as sintering aid to the silicon nitride powder, and then, adding a dispersion medium (organic solvent) and a dispersant if needed, and crushing these materials using a ball mill (S101).

Next, slurry for coating is prepared by adding an organic binder and others, and performing vacuum defoaming if needed, and then, adjusting a viscosity into a predetermined range. Then, a sheet-shaped green body is prepared by shaping the prepared slurry for coating into a sheet by using a sheet shaping machine, cutting the sheet to have a predetermined size, and then, drying it (S102).

Subsequently, the green body is densified and sintered by heating the resultant sheet-shaped green body (S103). As described above, the silicon nitride substrate can be manufactured.

The thermal conductivity of the silicon nitride substrate manufactured by the above-described related art is about 90 W/(m·K). Regarding this point, the present inventors have studied improvement of the thermal conductivity of the silicon nitride substrate. As a result, in the related art, the present inventors have obtained the findings being that it is difficult to further improve the thermal conductivity because of the usage of the silicon nitride powder. In other words, the present inventors have obtained the findings being that it is difficult to further improve the thermal conductivity of the silicon nitride substrate manufactured by the related art because it is difficult to obtain the silicon nitride powder with a high purity since the silicon nitride powder contains a lot of impurities. Accordingly, usage of not the silicon nitride powder but silicon powder is conceivable. This is because the silicon powder with a high purity is easier to be obtained since the silicon powder is less in the impurities than the silicon nitride powder. In other words, it is conceivable that the reduction of the thermal conductivity due to the impurities can be suppressed because a purity of the silicon powder is higher than that of the silicon nitride powder. Therefore, the present embodiment adopts a method of manufacturing the silicon nitride substrate using not the silicon nitride powder but the silicon powder.

<Method of Manufacturing Silicon Nitride Substrate According to Embodiment>

The method of manufacturing the silicon nitride substrate adopted in the present embodiment will be explained below.

Figure 4:
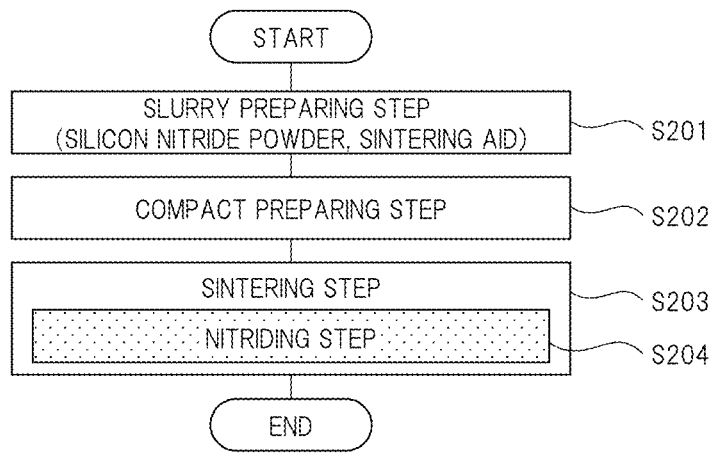
FIG. 4 is a flowchart showing steps of manufacturing a silicon nitride substrate according to an embodiment.

FIG. 4 is a flowchart showing steps of manufacturing the silicon nitride substrate according to the present embodiment.

1. Slurry Preparing Step

In the present embodiment, the slurry is prepared using the raw material powder resulting from addition of the rare-earth element oxide and the magnesium compound as the sintering aid to the silicon powder (S201).

<<Silicon>>

In the present embodiment, silicon powder of an industrially available grade is usable. The silicon before the crushing is desirably powder having, for example, a median diameter D50 that is equal to or larger than 6 µm, a BET specific surface area that is equal to or smaller than 3 m$^2$/g, an oxygen amount that is equal to or less than 1.0 mass % and an impurity carbon amount in silicon that is equal to or less than 0.15 mass %. Further, this is more desirably powder having, for example, a median diameter D50 that is equal to or larger than 7 µm, a BET specific surface area that is equal to or smaller than 2.5 m$^2$/g, an oxygen amount that is equal to or less than 0.5 mass % and an impurity carbon amount in silicon that is equal to or less than 0.10 mass %.

Particularly, the purity of the silicon powder is desirably equal to or higher than 99%, more desirably equal to or higher than 99.5%. This is because the less impurity oxygen is desirable in a viewpoint of the improvement of the thermal conductivity of the silicon nitride substrate since the impurity oxygen contained in the silicon is one of causes inhibiting the thermal conduction in the silicon nitride substrate resulted from the reaction sintering.

Further, it is desirable to adjust the raw material powder by limiting the oxygen amount derived from the magnesium compound so that a total amount of the impurity oxygen contained in the silicon powder and the oxygen derived from the magnesium compound is in a range that is equal to or more than 0.1 mass % and equal to or less than 1.1 mass % with respect to the silicon converted in terms of the silicon nitride. Also, the impurity carbon contained in the silicon inhibits the growth of the silicon nitride particles of the silicon nitride substrate resulted from the reaction sintering. As a result, the green body ion tends to be insufficient, and this becomes one of causes of the reduction of the thermal conductivity and the reduction of the insulating property of the silicon nitride substrate, and therefore, the impurity carbon is desirably as less as possible.

In the present specification, note that the BET specific surface area (m$^2$/g) is a value obtained by a BET one-point method ("Measuring methods for the specific surface area of fine ceramic powders by gas adsorption using the BET method", JIS R 1626:1996) using a BET specific surface area meter. The median diameter D50 (µm) is a grain diameter at which a cumulative frequency of a grain size distribution provided by a laser diffraction scattering method is 50%.

<<Rare-Earth Element Oxide>>

In the present embodiment, oxide of yttrium (Y), ytterbium (Yb), gadolinium (Gd), erbium (Er), lutetium (Lu) or others that is easily available and stable in the oxide form is used as the rare-earth element oxide. Specifically, yttrium oxide ($Y_2O_3$), ytterbium oxide ($Yb_2O_3$), gadolinium oxide ($Gd_2O_3$), erbium oxide ($Er_2O_3$), lutetium oxide ($Lu_2O_3$) and others are exemplified as the rare-earth element oxide.

A content of the rare-earth element oxide is, for example, equal to more than 0.5 mol % and less than 2 mol % with respect to a total of the silicon (converted in terms of the silicon nitride), the rare-earth element oxide (converted in terms of trivalent oxide) and the magnesium compound (converted in terms of MgO). If the content of the rare-earth element oxide is less than 0.5 mol %, the effect of its function as the sintering aid is insufficient, and the density is not sufficiently increased. On the other hand, if the content of the rare-earth element oxide is equal to more than 2.0 mol %, the grain boundary phase having the low thermal conductivity increases, and therefore, the thermal conductivity of the sintered body decreases, and the usage amount of the rare-earth element oxide that is expensive increases. Particularly, the content of the rare-earth element oxide is desirably equal to more than 0.6 mol % and less than 2 mol %, and more desirably equal to more than 1 mol % and equal to or less than 1.8 mol %.

In the present specification, note that a total of a molar number of the silicon nitride ($Si_3N_4$) obtained by nitriding all the silicon, a molar number of the rare-earth element oxide converted in terms of trivalent oxide ($RE_2O_3$: "RE" is a rare-earth element) and a molar number of the magnesium compound converted in terms of MgO is simply referred to as "total of the silicon (converted in terms of the silicon nitride), the rare-earth element oxide (converted in terms of trivalent oxide) and the magnesium compound (converted in terms of MgO)" in some cases.

<<Magnesium Compound>>

One, two or more types of the magnesium compound containing "Si", "N" or "O" are usable as the magnesium compound. Particularly, magnesium oxide (MgO), magnesium silicon nitride ($MgSiN_2$), magnesium silicide ($Mg_2Si$), magnesium nitride ($Mg_3N_2$) or others is desirably used.

In this case, the content is selected so that 87 mass % or more of the total of the magnesium compound is the magnesium silicon nitride. By the usage of the magnesium silicon nitride of 87 mass % or more, the oxygen concentration in the resultant silicon nitride substrate can be reduced. If the content of the magnesium silicon nitride of the magnesium compound is less than 87 mass %, the oxygen amount of the sintered silicon nitride powders is large. As a result, the thermal conductivity of the sintered body (silicon nitride substrate) decreases. Therefore, in order to improve the thermal conductivity of the silicon nitride substrate, the content of the magnesium silicon nitride of the magnesium compound is desirably large, and more desirably, for example, equal to or more than 90 mass %.

A content of the magnesium compound (converted in terms of MgO) of the silicon nitride substrate is, for example, equal to or more than 8 mol % and less than 15 mol % of the total of the silicon (converted in terms of the silicon nitride), the rare-earth element oxide (converted in terms of trivalent oxide) and the magnesium compound (converted in terms of MgO). If the content of the magnesium compound is less than 8 mol %, the effect of its function as the sintering aid is insufficient, and the density is not sufficiently increased. On the other hand, if the content of the magnesium compound is equal to more than 15 mol %, the grain boundary phase having the low thermal conductivity increases, and therefore, the thermal conductivity of the sintered body decreases. Particularly, the content of the magnesium compound is desirably equal to more than 8 mol % and less than 14 mol %, and more desirably equal to more than 9 mol % and equal to or less than 11 mol %.

The slurry is prepared using the silicon, the rare-earth element oxide and the magnesium compound (S201). Specifically, the slurry that is a dispersed material of a raw material powder is prepared by adding the rare-earth element oxide and the magnesium compound as the sintering aid having a predetermined ratio to the silicon powder, and then, adding a dispersion medium (organic solvent) and a dispersant if needed, and crushing these materials using a ball mill. As the dispersion medium, ethanol, n-butanol, toluene or others is usable. Also, as the dispersant, for example, sorbitan-ester type dispersant, polyoxy-alkylene type dispersant or others is usable.

A usage amount of the dispersion medium is desirably, for example, equal to or more than 40 mass % and equal to or less than 70 mass % of the total amount of the raw material powder, and a usage amount of the dispersant is desirably, for example, equal to or more than 0.3 mass % and equal to or less than 2 mass % of the total amount of the raw material powder. After the dispersion, note that the dispersion medium may be removed or replaced with other dispersion medium if needed.

2. Green-Body Preparing Step

Slurry for coating is prepared by adding, for example, the dispersion medium, an organic binder, the dispersant and others to the slurry provided as described above, and performing vacuum defoaming thereto if needed, and then, adjusting a viscosity into a predetermined range.

Then, a sheet-shaped green body is prepared by shaping the prepared slurry for coating into a sheet by using a sheet shaping machine, cutting the sheet to have a predetermined size, and then, drying it (S202).

The organic binder used for the preparation of the slurry for coating is not particularly limited. However, a PVB based resin (polyvinyl butyral resin), an ethyl-cellulose based resin, an acrylic resin and others are exemplified. It is desirable to appropriately adjust the addition amounts of the dispersion medium, the organic binder, the dispersant and others in accordance with the coating condition.

A method of shaping the slurry for coating to have the sheet shape is not particularly limited. However, a sheet shaping method such as a doctor blade method and an extrusion molding method is usable.

A thickness of the sheet-shaped green body formed by the green-body preparing step is, for example, equal to or larger than 0.15 mm and equal to or smaller than 0.8 mm. The prepared sheet-shaped green body is cut to have the predetermined size by, for example, a puncher or others if needed.

3. Sintering Step

A sintering step for the compaction after nitriding the silicon contained in the green body by heating the prepared sheet-shaped green body is performed (S203). The sintering step includes: a degreasing step of removing the organic binder contained in the green body; a nitriding step (S204) of forming the silicon nitride by making a reaction between the nitrogen and the silicon contained in the green body; and a compaction sintering step performed after the nitriding step. In other words, the silicon nitride substrate according to the present embodiment is a silicon nitride substrate resulted from the nitriding of the silicon contained in the sheet-shaped green body. A thickness of the silicon nitride substrate is, for example, equal to or larger than 0.15 mm and equal to or smaller than 0.8 mm. These steps may be performed stepwise in different furnaces, or successively in the same furnace.

Figure 5:
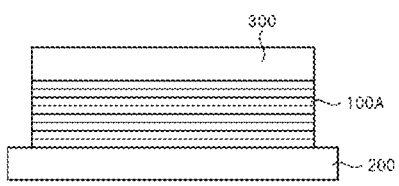
FIG. 5 is a diagram showing a state of layered arrangement of a green body.

In the sintering step, for example, as shown in FIG. 5, a plurality of the prepared sheet-shaped green bodies 100A are layered above a plate setter 200 made of boron nitride (BN) to insert a separating medium (not illustrated) therebetween, a weight 300 is arranged on the uppermost layer of the plurality of layered green bodies 100A, and these members are placed in an electric furnace. The step of removing the organic binder (the degreasing step) is performed in this state, and then, the nitriding step is performed by performing a decarbonization process at a temperature of 900° C. to 1300° C. in a nitriding machine and rising the temperature to a predetermined temperature under the nitrogen atmosphere. Then, the compaction sintering step is performed in a sintering machine. Such a sintering step is performed while a weight that is, for example, equal to or larger than 10 Pa and equal to or smaller than 1000 Pa is applied to the green bodies 100A by the weight 300.

Note that a boron nitride (BN) powder layer having a thickness that is, for example, about equal to or larger than 3 μm and equal to or smaller than 20 μm is used as the separating medium. The boron nitride powder layer has a function of easily separating the sintered silicon nitride substrate (sintered body). The boron nitride powder layer is formed by, for example, spray coating, brush coating or screen printing to apply the slurry-state boron nitride powder to one-side surface of each sheet-shaped green body 100A. The boron nitride powder desirably has, for example, a purity that is equal to or higher than 95% and an average grain diameter (D50) that is equal to or larger than 1 μm and equal to or smaller than 20 μm.

The silicon nitride substrate can be manufactured as described above. Particularly, by the method of manufacturing the silicon nitride substrate according to the present embodiment, the silicon nitride substrate having the thermal conductivity that is, for example, equal to or higher than 110 W/(m·K) can be manufactured since the highly-purified silicon powder is used. However, from the present inventor's studies, it has been found that the above-described method of manufacturing the silicon nitride substrate has a room for improvement. Therefore, this point will be explained below.

<Room for Improvement>

In the above-described method of manufacturing the silicon nitride substrate, not the silicon nitride powder but the silicon powder is used. Therefore, the nitriding process is necessary. Regarding this point, the present inventors have newly found out that the color unevenness is generated on the surface of the manufactured silicon nitride substrate, depending on the heating condition of the nitriding process.

A term "surface" of the silicon nitride substrate mentioned in this specification means not only a "front surface" serving as a first surface but also a "back surface" serving as a second surface opposite to the first surface. For example, when the color unevenness is generated on the "surface" of the silicon nitride substrate, it can be appropriately said that the color unevenness is generated on the "front surface or back surface" of the silicon nitride substrate. In other words, the term "surface" mentioned in this specification is used to mean "at least one surface of the front surface and back surface" for avoiding the complicated expression.

Figure 6:
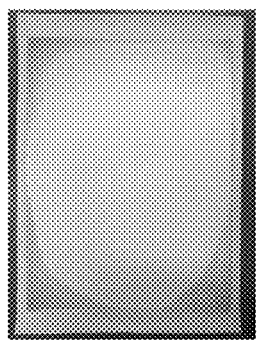
FIG. 6 is a photograph showing a surface of the silicon nitride substrate with generation of color unevenness.

And, the term "color unevenness" mentioned in this specification means that, for example, color of the center of the rectangular silicon nitride substrate and color of the edge of the same are different from each other. Specifically, FIG. 6 is a photograph showing the surface of the silicon nitride substrate with the generation of the color unevenness. In FIG. 6, the center of the silicon nitride substrate is whitish while the edge of the silicon nitride substrate is blackish, and it is found that the color unevenness is generated on the silicon nitride substrate, from the comparison between the color of the center and the color of the edge.

For example, adhesion of foreign objects and dusts on the surface of the silicon nitride substrate becomes a cause of contact failure with a "brazing member" or electrical insulation failure of the silicon nitride substrate itself, and therefore, it is necessary to remove the foreign objects and dusts. Therefore, in order to detect the adhesion of foreign objects and dusts on the silicon nitride substrate, an appearance test is performed. However, the generation of the color unevenness as shown in FIG. 6 causes a risk that the color unevenness is erroneously detected as the adhesion of foreign objects and dusts. Specifically, in consideration of the fact that the foreign objects and dusts are often recognized as a black region (black point), there is a risk that, for example, the edge region of the silicon nitride substrate shown in FIG. 6 is erroneously detected as the region with the adhesion of the foreign objects and dusts because of being blackish. Therefore, it is found that a contrivance to suppress the color unevenness generated on the surface of the silicon nitride substrate is desirable in order to suppress the erroneous detection in the appearance test.

<<(Presumed) Mechanism of Generation of Color Unevenness>>

Accordingly, in order to suppress the color unevenness generated on the surface of the silicon nitride substrate, the present inventors have endeavored first to study a mechanism of the generation of the color unevenness on the surface of the silicon nitride substrate. As a result, the present inventors have presumed the following mechanism of the generation of the color unevenness, and therefore, this presumed mechanism of the generation of the color unevenness will be explained.

The nitriding step is performed by, for example, as shown in FIG. 5, the heating process under the nitrogen atmosphere in the state in which the plurality of the sheet-shaped green bodies 100A are arranged on the plate setter 200 while the weight 300 is arranged on the layered green bodies 100A. In this case, when attention is paid to, for example, a first green body sandwiched by upper and lower green bodies 100A of the layered green bodies 100A, heat tends to remain at its center of this first green body. Therefore, the first green body has a temperature distribution showing a high temperature at the center and a low temperature at the edge. In this case, the nitriding reaction advances at the center having the high temperature while the nitriding reaction is difficult to advance at the edge. In consideration of the fact that the nitriding reaction is an exothermic reaction, the positive feedback of the heat generation amount is caused at the center where the nitriding reaction advances, and, as a result, its temperature rapidly rises. If a degree of the temperature rise is large, it is conceivable that "thermal runaway" causing the temperature of the center to be higher than a melting point of the silicon to melt the silicon is generated while the nitridation is insufficient at the edge since the temperature difference between the center and the edge is large. If the sintering process is performed in such an insufficient nitridation state, it is presumed that the silicon that is not nitrided at the end remains at the edge to generate the color unevenness. In other words, the present inventors have presumed that the color unevenness is generated by the remaining of the silicon that is not nitrided.

Based on such a presumed mechanism, it is conceivable that the color unevenness generated on the surface of the silicon nitride substrate is caused by the temperature rising step in the nitriding process. In other words, it is conceivable that, if the temperature rising step is performed while the temperature distribution is achieved to have the small temperature difference between the temperature of the center and the temperature of the edge, the color unevenness can be suppressed along with the suppression of the "thermal runaway". Accordingly, in the present embodiment, a contrivance is made for the temperature rising step in the nitriding process. A technical idea with this contrivance of the present embodiment will be explained below.

<Basic Idea of Embodiment>

The basic idea of the present embodiment is an idea that is heating of the green body along with maintaining the temperature distribution having the small temperature difference between the center and the edge by the suppression of the rapid temperature rise in the nitriding process. In other words, the basic idea is an idea that is such suppression of the rapid temperature rise as securing the time for sufficiently moderating the temperature difference between the temperature of the center and the temperature of the edge.

By this basic idea, the temperature can be gradually risen while the temperature difference between the temperature of the center and the temperature of the edge is made gradually small, and therefore, the problem of the insufficient nitridation at the edge can be solved while the "thermal runaway" due to the rapid nitriding reaction at the center is suppressed.

Particularly, for the temperature rising step of the nitriding process, the basic idea adopts a contrivance to bring an average of a temperature rise amount per unit time (referred to as a gradient of the heating temperature below) in a range from 1270° C. to 1340° C. to be equal to or lower than a predetermined value. For example, the average of the gradient of the heating temperature is preferably equal to or lower than 3.1° C./h. The maximum heating temperature is preferably equal to or higher than 1390° C. and equal to or lower than 1500° C.

In this manner, by the basic idea, the temperature can be risen as gradual as the time for sufficiently moderating the temperature difference between the temperature of the center and the temperature of the edge is secured. Therefore, the problem of the insufficient nitridation at the edge of the green body can be solved by the basic idea, and, as a result, the color unevenness generated on the surface of the silicon nitride substrate manufactured at the end can be reduced. Therefore, the erroneous detection in the appearance test due to the color unevenness can be reduced by the basic idea, and, as a result, the significant effect capable of improving the accuracy of the detection for the foreign objects and dusts can be provided.

Specific Aspect

A specific aspect embodying this basic idea will be explained below.

Each silicon nitride substrate of a first working example, a second working example and a comparative example was manufactured by the method described in the chapter "<Method of Manufacturing Silicon Nitride Substrate according to Embodiment>". Each silicon nitride substrate has a first surface and a second surface, and its planar shape is rectangular. Regarding each side length of each silicon nitride substrate, a long side length is 200 mm, and a short side length is 140 mm. A thickness of each silicon nitride substrate is 0.32 mm.

A molar ratio of the rare-earth oxide with respect to the total of the silicon, the rare-earth oxide and the magnesium compound at the time of manufacture of each silicon nitride substrate is 1.2 mol %, a molar ratio of the magnesium compound is 9.8 mol %.

Figure 7:
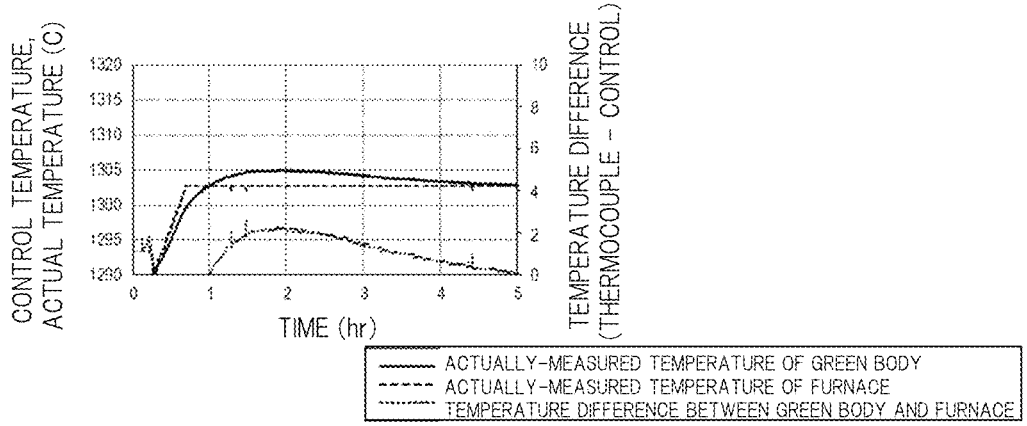
FIG. 7 is a graph showing a practically-measured temperature of a green body, a practically-measured temperature of a furnace and temperature difference between the green body and the furnace in a predetermined temperature range of a first working example.

At the time of manufacture of the silicon nitride substrate of the first working example, in the nitriding step S204, the heating temperature is risen up to the maximum heating temperature in an aspect in which the heating temperature is sequentially risen stepwise along with elapse of heating time. The maximum heating temperature is 1400° C. The average of the gradient of the heating temperature in the temperature rise range from 1270° C. to 1340° C. is 2.99° C./h. FIG. 7 shows a practically-measured temperature of the green body, a practically-measured temperature of the furnace and the temperature difference between the green body and the furnace in a predetermined temperature region. A horizontal axis of FIG. 7 indicates elapsed time from reference time at which the practically-measured temperature of the furnace to be the heating temperature nearly reaches 1300° C. When the practically-measured temperature of the furnace is nearly 1300° C., the temperature difference between the practically-measured temperature of the furnace and the temperature of the green body in the furnace is equal to or lower than 20° C. In the first working example, the rapid temperature rise of the green body in the nitriding process is not caused, and the "thermal runaway" is not caused. The thermal conductivity of the silicon nitride substrate of the first working example is 129 W/(m·K).

Figure 8:
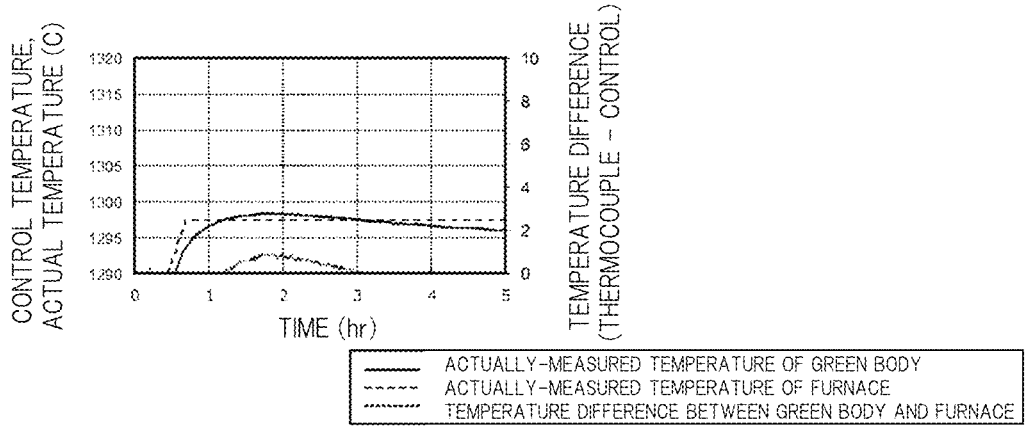
FIG. 8 is a graph showing a practically-measured temperature of a green body, a practically-measured temperature of a furnace and temperature difference between the green body and the furnace in a predetermined temperature range of a second working example.

At the time of manufacture of the silicon nitride substrate of the second working example, in the nitriding step S204, the heating temperature is risen up to the maximum heating temperature in an aspect in which the heating temperature is sequentially risen stepwise along with elapse of heating time. The maximum heating temperature is 1400° C. The average of the gradient of the heating temperature in the temperature rise range from 1270° C. to 1340° C. is 3.02° C./h. FIG. 8 shows a practically-measured temperature of the green body, a practically-measured temperature of the furnace and the temperature difference between the green body and the furnace in a predetermined temperature region. A horizontal axis of FIG. 8 indicates elapsed time from reference time at which the practically-measured temperature of the furnace to be the heating temperature nearly reaches 1300° C. When the practically-measured temperature of the furnace is nearly 1300° C., the temperature difference between the practically-measured temperature of the furnace and the temperature of the green body in the furnace is equal to or lower than 20° C. In the second working example, the rapid temperature rise of the green body in the nitriding process is not caused, and the "thermal runaway" is not caused. The thermal conductivity of the silicon nitride substrate of the second working example is 126 W/(m·K).

Figure 9:
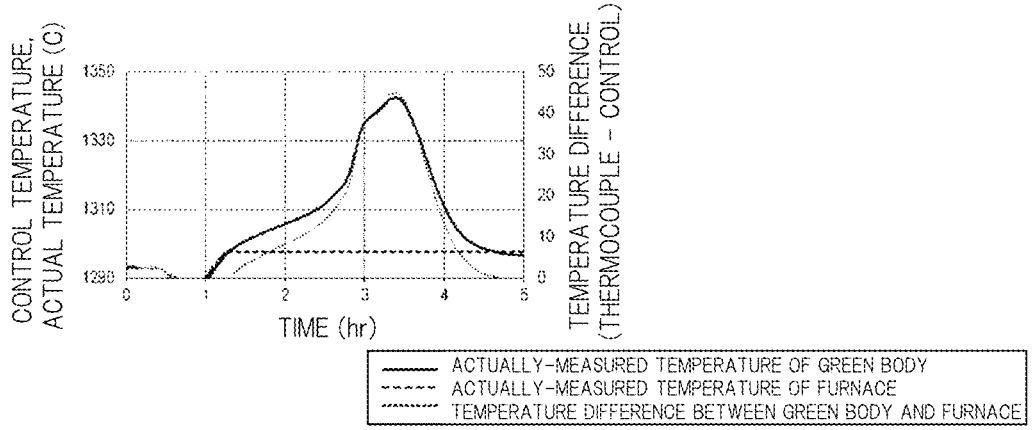
FIG. 9 is a graph showing a practically-measured temperature of a green body, a practically-measured temperature of a furnace and temperature difference between the green body and the furnace in a predetermined temperature range of a comparative example.

At the time of manufacture of the silicon nitride substrate of the comparative example, in the nitriding step S204, the heating temperature is risen up to the maximum heating temperature in an aspect in which the heating temperature is sequentially risen stepwise along with elapse of heating time. The maximum heating temperature is 1400° C. The average of the gradient of the heating temperature in the temperature rise range from 1270° C. to 1340° C. is 4.67° C./h. FIG. 9 shows a practically-measured temperature of the green body, a practically-measured temperature of the furnace and the temperature difference between the green body and the furnace in a predetermined temperature region. A horizontal axis of FIG. 9 indicates elapsed time from reference time at which the practically-measured temperature of the furnace to be the heating temperature nearly reaches 1300° C. When the practically-measured temperature of the furnace is nearly 1300° C., the temperature difference between the practically-measured temperature of the furnace and the temperature of the green body in the furnace is higher than 20° C. and is 44.9° C. at maximum. In other words, in the comparative example, the rapid temperature rise of the green body in the nitriding process is caused, and the "thermal runaway" is caused. The thermal conductivity of the silicon nitride substrate of the comparative example is 120 W/(m·K).

Evaluation results showing that the color unevenness can be reduced in the silicon nitride substrate manufactured under the heating condition described in the first or second working example will be explained below.

<Evaluation Results>
<<Quantitative Evaluation Method of Color Unevenness>>

First, a quantitative evaluation method of the color unevenness will be explained.

In the present embodiment, a "color space" is utilized for the evaluation of the color unevenness.

Figure 10:
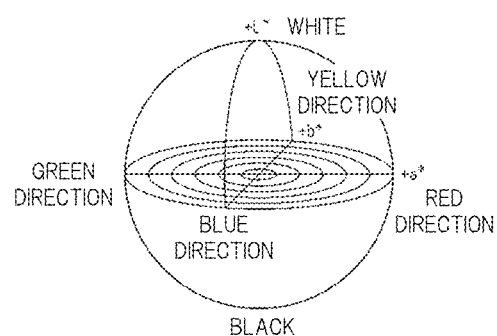
FIG. 10 is a schematic diagram showing a three-dimensional image of a "color space"

FIG. 10 is a schematic diagram showing a three-dimensional image of the "color space".

Configuring parameters of the "color space" shown in FIG. 10 include the following parameters.

<<<Lightness L*>>>

A parameter "lightness L*" is an index representing brightness and darkness in color grade. A value of the "lightness L*" is in a range of "0≤L*≤100". The larger the value of the "lightness L*" is, the brighter and the more whitish the color grade is. On the other hand, the smaller the value of the "lightness L*" is, the darker and the more blackish the color grade is.

<<<Chromaticness Index a*>>>

A parameter "chromaticness index a*" is an index representing a color grade level in a range from red color to green color. A value of the "chromaticness index a*" is in a range of "−60≤a*≤+60". The larger in a positive direction the value of the "chromaticness index a*" is, the redder the color grade is. The larger in a negative direction the value of the "chromaticness index a*" is, the greener the color grade is. The smaller an absolute value of the "chromaticness index a*" is, the moresmoky (somber) the color grade is.

<<<Chromaticness Index b*>>>

A parameter "chromaticness index b*" is an index representing a color grade level in a range from yellow color to blue color. A value of the "chromaticness index b*" is in a range of "−60≤b*≤+60". The larger in a positive direction the value of the "chromaticness index b*" is, the yellower the color grade is. The larger in a negative direction the value of the "chromaticness index b*" is, the bluer the color grade is. The smaller an absolute value of the "chromaticness index b*" is, the more smoky (somber) the color grade is.

The above-described "lightness L*", "chromaticness index a*" and "chromaticness index b*" are measured in conformity with "JIS Z 8722:2000". For example, in the present embodiment, the parameters are measured by a SCI (including reflected light) method showing a material color. In this case, "CR-400 produced by KONICA MINOLTA, INC." is used as a measuring apparatus, and the measurement is performed under setting with "viewing angle: approximation of 2-degree CIE color-matching function" and "light source: C". Note that the silicon nitride substrate is placed on 10 layered PPC papers, and a surface of the silicon nitride substrate opposite to a surface in contact with the PPC papers is measured by the above-described measuring apparatus.

<<<Chromaticness C*>>>

A parameter "chromaticness C*" is calculated based on the "chromaticness index a*" and the "chromaticness index b*" based on the following numerical expression 1.

$$C^* = \sqrt{\{(a^*)^2 + (b^*)^2\}}$$  Numerical Expression 1

<<<Color Difference ΔE*ab>>>

A parameter "color difference ΔE*ab" is an index representing difference between the reference color and the color, and is calculated based on the "lightness L*", the "chromaticness index a*" and the "chromaticness index b*".

Figure 11:
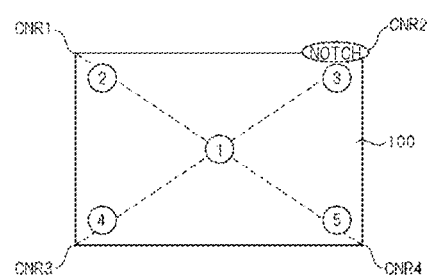
FIG. 11 is a diagram schematically showing the silicon nitride substrate.

FIG. 11 is a diagram schematically showing the silicon nitride substrate 100. A "position 1" represents a region corresponding to the center while "position 2", "position 3", "position 4" and "position 5" represent regions corresponding to four edges. In the present embodiment, the color of the "position 1" is set as the reference color, and the "color difference ΔE*ab" at each of the "position 2" to the "position 5" is calculated.

Specifically, the "position 1" to the "position 5" are defined as the following positions.

"Position 1": that is a position on the surface at which diagonal lines cross each other.

"Position 2": that is a position on the surface, shifting inward from a corner CNR1 by 15 mm in a direction toward the "position 1".

"Position 3": that is a position on the surface, shifting inward from a corner CNR2 by 15 mm in a direction toward the "position 1".

"Position 4": that is a position on the surface, shifting inward from a corner CNR3 by 15 mm in a direction toward the "position 1".

"Position 5": that is a position on the surface, shifting inward from a corner CNR4 by 15 mm in a direction toward the "position 1".

Note that a measuring area is a region of "20 mm×20 mm" centering each position of the "position 1" to the "position 5".

<<Evaluation Results of Color Unevenness>>

Since the color unevenness of samples #1 to #4 have been evaluated using the configuring parameters of the "color space", the evaluation results will be explained below.

The "sample #1" is a silicon nitride substrate manufactured by the nitriding process under the heating condition of the first working example, and the "sample #2" is a silicon nitride substrate manufactured by the nitriding process under the heating condition of the second working example. Each of the "sample #3" and the "sample #4" is a silicon nitride substrate manufactured by the nitriding process under the heating condition of the comparative example.

TABLE 1

| Sample | Position | L* | a* | b* | C* | $\Delta E^*ab$ |
|---|---|---|---|---|---|---|
| #1 | 1 | 81.30 | −1.25 | 12.49 | 12.55 | — |
|  | 2 | 81.70 | −1.35 | 11.78 | 11.86 | 0.82 |
|  | 3 | 81.81 | −1.36 | 11.83 | 11.91 | 0.84 |
|  | 4 | 81.68 | −1.38 | 11.54 | 11.62 | 1.03 |
|  | 5 | 82.01 | −1.39 | 11.61 | 11.69 | 1.14 |
| #2 | 1 | 83.50 | −0.91 | 13.89 | 13.92 | — |
|  | 2 | 83.15 | −0.95 | 13.30 | 13.33 | 0.69 |
|  | 3 | 83.27 | −0.96 | 13.23 | 13.26 | 0.70 |
|  | 4 | 83.21 | −0.98 | 13.24 | 13.28 | 0.72 |
|  | 5 | 83.43 | −1.03 | 13.27 | 13.31 | 0.64 |
| #3 | 1 | 83.98 | −0.43 | 7.92 | 7.93 | — |
|  | 2 | 84.61 | −0.64 | 6.44 | 6.47 | 1.62 |
|  | 4 | 84.47 | −0.58 | 6.58 | 6.61 | 1.43 |
| #4 | 1 | 81.85 | −0.33 | 10.03 | 10.04 | — |
|  | 2 | 82.62 | −0.61 | 7.40 | 7.43 | 2.75 |
|  | 4 | 82.91 | −0.60 | 7.29 | 7.31 | 2.95 |

The table 1 is a table showing the evaluation results of the color unevenness of the "sample #1" to the "sample #4". As shown in the table 1, the thermal conductivity of 130 W/(m·K) was achieved in all of the "sample #1" to the "sample #4".

However, each of the "sample #3" and the "sample #4" representing the comparative examples has a position at which the "color difference $\Delta E^*ab$" is higher than 1.5. This means that the silicon nitride substrate manufactured under the heating conditions of the nitriding process in the comparative examples can provide the high thermal conductivity but has the color unevenness.

On the other hand, in the "sample #1" representing the first working example, the "color difference $\Delta E^*ab$" at all of the "position 2" to the "position 5" is equal to or lower than 1.5.

In the "sample #2" representing the second working example, the "color difference $\Delta E^*ab$" at all of the "position 2" to the "position 5" is equal to or lower than 0.8.

This means that the silicon nitride substrate manufactured under the heating conditions of the nitriding process in the first or second working example can provide the high thermal conductivity and reduce the color unevenness. Therefore, the first and second working examples can provide the silicon nitride substrate having the excellent heat-release property and reduce the erroneous detection in the appearance test due to the color unevenness.

Further, in the first and second working examples, the "Lightness L*" of each of the center (position 1) and the edges (positions 2 to 5) is equal to or higher than 70, and the "Chromaticness C*" of each of them is equal to or higher than 10. In this manner, contrast against the foreign objects and dusts is made clear, and, as a result, significant effect capable of improving the accuracy of the detection for the foreign objects and dusts in the appearance test can be provided.

The "edge" mentioned in the present specification is described as a concept including all of the "position 2" to the "position 5". In other words, the "edge" mentioned in the present specification includes all of the "position 2" to the "position 5". And, the "center" is described as a concept including the "position 1". Therefore, the phrase "when the color difference between the center and the edge is expressed to be "$\Delta E^*ab$", a relation "$\Delta E^*ab \leq 1.5$" is established" means that the color difference between the "position 1" and the "position 2" is equal to or lower than 1.5, means that the color difference between the "position 1" and the "position 3" is equal to or lower than 1.5, means that the color difference between the "position 1" and the "position 4" is equal to or lower than 1.5, and means that the color difference between the "position 1" and the "position 5" is equal to or lower than 1.5.

Similarly, the phrase "the lightness at each of the "center" and the "edge" is equal to or higher than 70" means that the lightness at each of the "position 1" to the "position 5" is equal to or higher than 70.

Also, the phrase "the chromaticness at each of the "center" and the "edge" is equal to or higher than 10" means that the chromaticness at each of the "position 1" to the "position 5" is equal to or higher than 10.

OVERVIEW

In the present embodiment, the contrivance is made so that the average of the gradient of the heating temperature of the temperature rising step in the nitriding process is equal to or lower than 3.1° C./h in the range from 1270° C. to 1340° C.

In this manner, the present embodiment can provide the silicon nitride substrate having the "color difference $\Delta E^*ab$" that is equal to or lower than 1.5, more specifically equal to or lower than 0.8. Therefore, the technical idea of the present embodiment is excellent in that the color unevenness can be reduced. In other words, it can be said that the technical idea of the present embodiment has the remarkable technical significance in a viewpoint in which the accuracy of the detection for the foreign objects or dusts in the appearance test can be improved because of the reduction of the color unevenness.

Note that the technical idea of the present embodiment is effectively applied to a silicon nitride substrate having a large size. Specifically, for example, as shown in FIG. 2, the technical idea of the present embodiment is effectively applied to a configuration or others in which six semiconductor devices configuring a three-phase inverter circuit are mounted on one silicon nitride substrate. This would be because the usage of the silicon nitride substrate having the large size has a large potential of occurrence of the color unevenness.

Regarding this point, it is conceivable that the application of the technical idea of the present embodiment to the manufacturing of the silicon nitride substrate having the large size having the large potential of occurrence of the color unevenness is effective for reducing the color unevenness. Particularly, the technical idea of the present embodiment is effectively applied to manufacturing a silicon nitride substrate having a rectangular shape, each side length of which is equal to or larger than 100 mm.

In the foregoing, the invention made by the present inventors has been concretely described on the basis of the embodiments. However, it is needless to say that the present invention is not limited to the foregoing embodiments and various modifications can be made within the scope of the present invention.

What is claimed is:

1. A silicon nitride substrate comprising:
   a first surface; and
   a second surface opposite to the first surface,
   wherein a planar shape is rectangular, each side length of which is equal to or larger than 100 mm,
   a thermal conductivity is equal to or higher than 110 W/(m·K),
   when color difference between a center and an edge of at least one surface of the first surface and the second surface is expressed to be "$\Delta E^*ab$", a relation "$0<\Delta E^*ab \leq 1.5$" is established at all edges positioned inward from each corner by 15 mm in a direction to the center.

2. The silicon nitride substrate according to claim 1, wherein a relation "$0<\Delta E^*ab \leq 0.8$" is established.

3. The silicon nitride substrate according to claim 1, wherein lightness at each of the center and the edge is equal to or higher than 70.

4. The silicon nitride substrate according to claim 1, wherein chromaticness at each of the center and the edge is equal to or higher than 10.

5. A method of manufacturing a silicon nitride substrate comprising steps of:
   (a) preparing a slurry containing silicon power;
   (b) forming a green body from the slurry; and
   (c) sintering the green body in a furnace,
   wherein the step (c) includes a nitriding step of nitriding the green body by heating the green body at a predetermined heating temperature, and,
   in the nitriding step, an average of a temperature rise amount per unit time in a range from 1270° C. to 1340° C. is equal to or lower than 3.1° C./h.

6. The silicon nitride substrate according to claim 2, wherein lightness at each of the center and the edge is equal to or higher than 70.

7. The silicon nitride substrate according to claim 2, wherein chromaticness at each of the center and the edge is equal to or higher than 10.

8. The silicon nitride substrate according to claim 3, wherein chromaticness at each of the center and the edge is equal to or higher than 10.

* * * * *